(12) United States Patent
Liu

(10) Patent No.: US 7,926,982 B2
(45) Date of Patent: Apr. 19, 2011

(54) LED ILLUMINATION DEVICE AND LIGHT ENGINE THEREOF

(75) Inventor: Tay-Jian Liu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 179 days.

(21) Appl. No.: 12/423,020

(22) Filed: Apr. 14, 2009

(65) Prior Publication Data

US 2010/0002433 A1  Jan. 7, 2010

(30) Foreign Application Priority Data

Jul. 4, 2008  (CN) .......................... 2008 1 0068320

(51) Int. Cl.
*F21V 29/00* (2006.01)
(52) U.S. Cl. ........ 362/294; 362/218; 362/373; 362/547; 362/549; 362/249.02
(58) Field of Classification Search .................. 362/294, 362/373, 218, 249.02
See application file for complete search history.

(56) References Cited

U.S. PATENT DOCUMENTS

| 7,654,703 | B2 * | 2/2010 | Kan et al. ...................... 362/362 |
| 7,674,012 | B1 * | 3/2010 | Lin et al. .................. 362/249.02 |
| 7,771,088 | B2 * | 8/2010 | Chen ............................. 362/294 |
| 7,810,958 | B2 * | 10/2010 | Liu et al. ...................... 362/294 |

FOREIGN PATENT DOCUMENTS

CN            201069134 Y       6/2008
* cited by examiner

*Primary Examiner* — Ali Alavi
(74) *Attorney, Agent, or Firm* — Frank R. Niranjan

(57) ABSTRACT

An LED illumination device includes a lampshade and a light engine arranged on the lampshade. The lampshade defines a room therein. The light engine includes a heat dissipation member, and a plurality of LEDs arranged on the heat dissipation member and received in the room of the lampshade. The heat dissipation member includes a heat pipe and a heat sink. The heat pipe forms a planar absorbing surface and a dissipating surface opposite to the absorbing surface. The absorbing surface of the heat pipe attaches to the LEDs to absorb heat therefrom. The heat sink includes a base attaching to the dissipating surface of the heat pipe to absorb heat of the heat pipe, and a plurality of fins extending from the base for dissipating heat absorbed from the heat pipe.

14 Claims, 6 Drawing Sheets

LED ILLUMINATION DEVICE AND LIGHT ENGINE THEREOF

BACKGROUND

1. Technical Field

The disclosure generally relates to LED illumination devices, and particularly to a light engine of an LED illumination device with high heat dissipating efficiency.

2. Description of Related Art

In recent years, LEDs are preferred for use in illumination devices rather than CCFLs (cold cathode fluorescent lamps) due to their excellent properties, including high brightness, long lifespan, wide color range, etc. For an LED, about eighty percents of the power consumed thereby is converted into heat. Therefore a heat dissipation device is necessary for timely and adequately removing the heat generated by the LED.

Conventional heat dissipation devices, such as heat sinks, are usually made of copper, aluminum, or their alloy, and have a relatively high heat conductivity coefficient. The heat sink generally includes a base attached to the LED illumination device and a plurality of fins extending from the base for increasing a heat dissipating area of the heat sink. During operation, heat generated by the LED illumination device is conducted to the base and then distributed to the fins for dissipation. However, for obtaining a high brightness LED illumination device, a large amount of LEDs are packaged in a single LED illumination device, and thus a large amount of heat is generated during operation of the high brightness LED illumination device. The conventional metal heat sinks, which transfer heat via heat conduction means, can no longer satisfy the heat dissipation requirement of the high brightness LED illumination device.

For the foregoing reasons, therefore, there is a need in the art for an LED illumination device which overcomes the limitations described.

DETAILED DESCRIPTION

Figure 1:
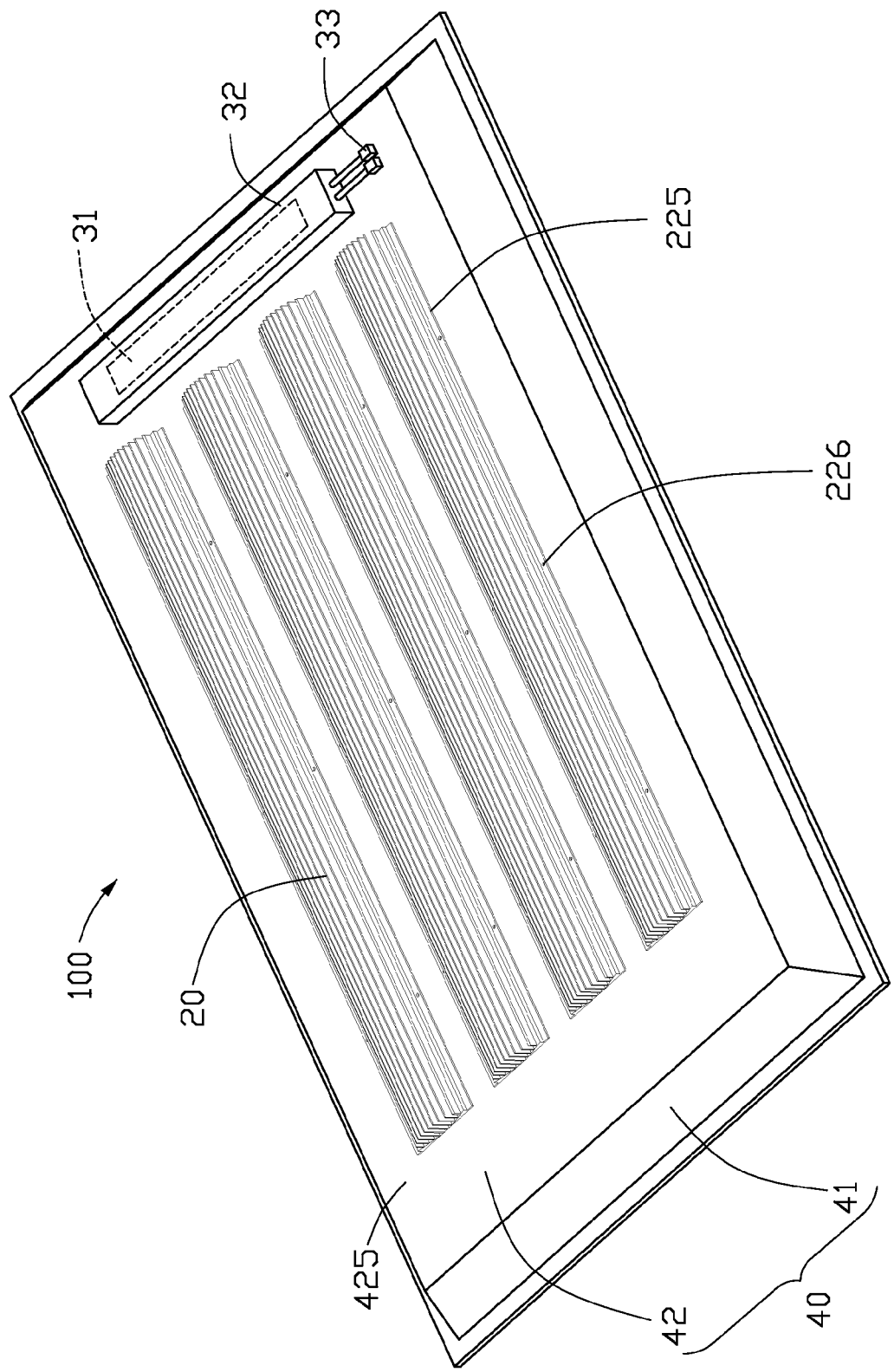
FIG. 1 is an isometric, assembled view of an LED illumination device according to an exemplary embodiment.
Figure 2:
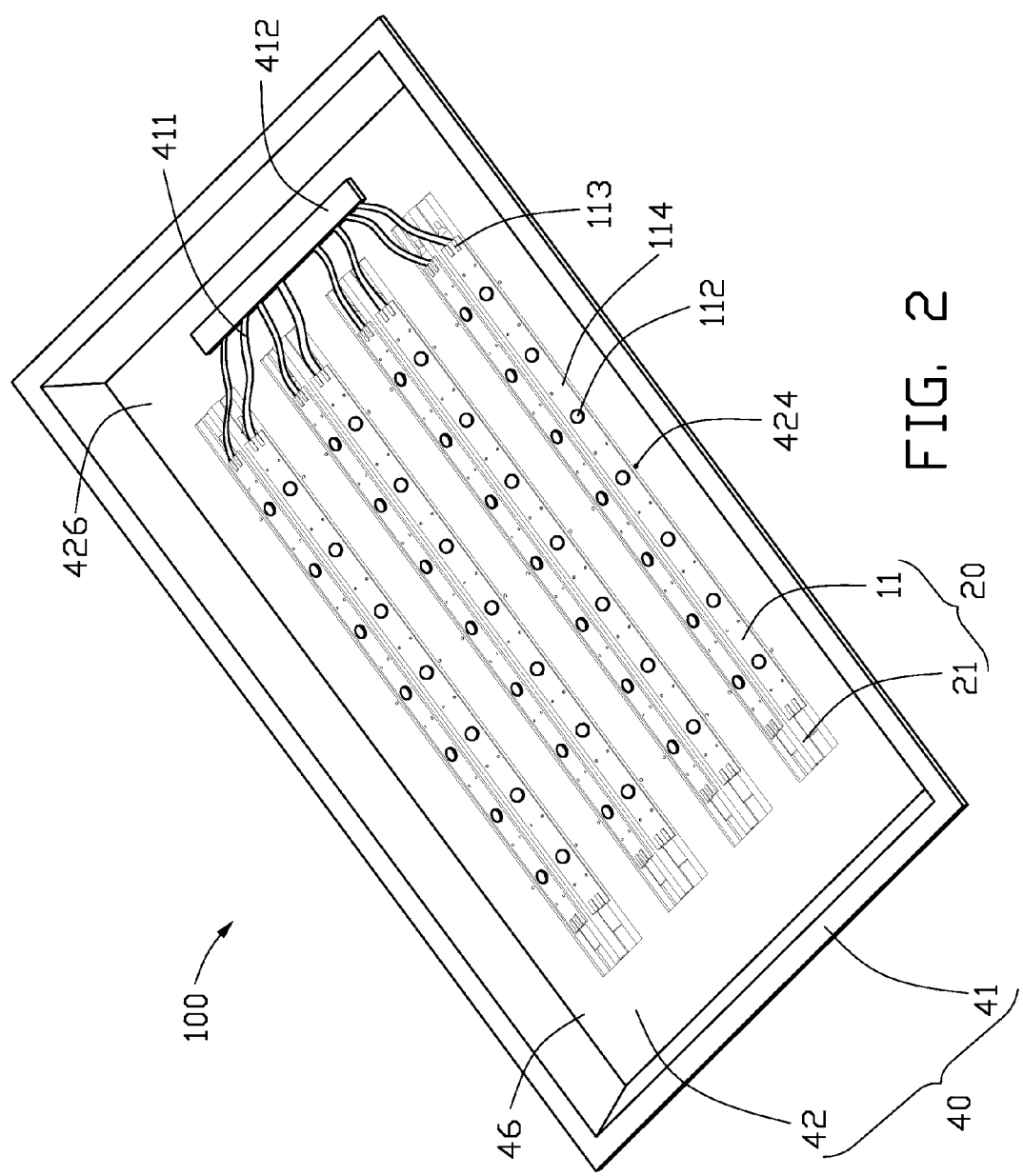
FIG. 2 shows the LED illumination device of FIG. 1 viewed from a bottom side.

Referring to FIGS. 1 and 2, an LED illumination device 100 according to an exemplary embodiment includes a lampshade 40 and a plurality of light engines 20 mounted on the lampshade 40. The plurality of light engines 20 are identical to each other, and are arranged parallel to each other. Each light engine 20 includes a light source 11 and a heat dissipation member 21 for dissipating heat of the light source 11.

Figure 3:
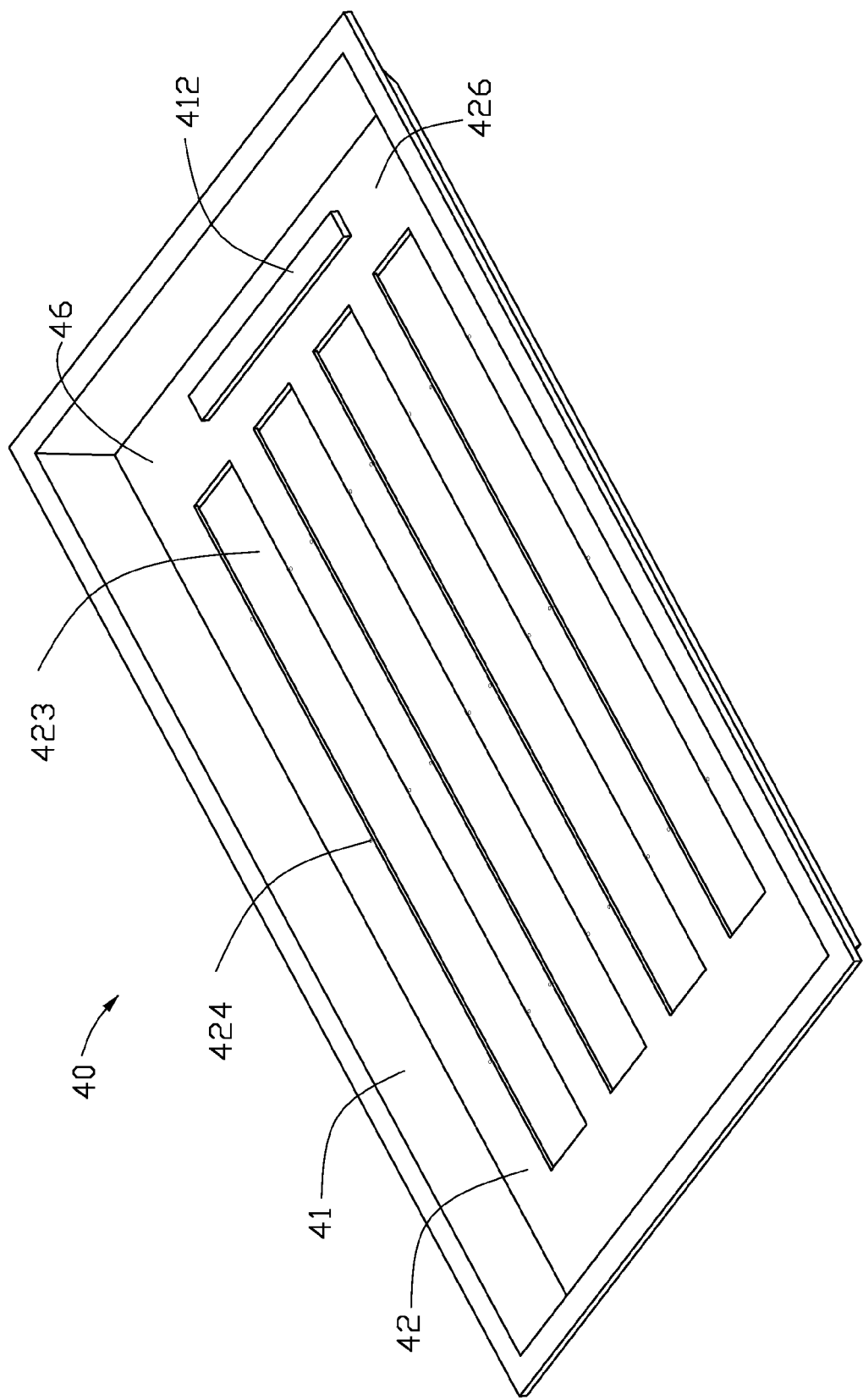
FIG. 3 shows a lampshade of the LED illumination device of FIG. 1 viewed from a bottom side.

Referring to FIG. 3, the lampshade 40 has a configuration of a substantially truncated, hollow pyramid, and defines a room 46 therein for accommodating the light engines 20 including the light sources 11 therein. The lampshade 40 includes a side wall 41 and a mounting wall 42. The mounting wall 42 is substantially rectangular. The side wall 41 extends downwardly and slightly outwardly from a periphery of the mounting wall 42. The room 46 is surrounded by the side wall 41, and expands slightly from the mounting wall 42 along a downward direction. A plurality of elongated openings 423 are defined in the mounting wall 42 for mounting the light engines 20. The openings 423 are parallel to and spaced from each other, and communicate with the room 46. A plurality of mounting holes 424 are defined in the mounting wall 42 at two opposite sides of each opening 423 for assembly a corresponding light engine 20 to the opening 423 of the mounting wall 42.

A junction box 412 is arranged on an inner side 426 of the mounting wall 42 and is received in the room 46. A circuit board 31 (FIG. 1) is arranged on an outer side 425 of the mounting wall 42 opposite to the inner side 426. The circuit board 31 and the junction box 412 are located adjacent to rear ends of the openings 423 of the mounting wall 42, and are electrically connected to each other. A cover 32 encapsulates the circuit board 31 therein to protect the circuit board 31 from environmental harm and mechanical damage. A plug 33 extends outwardly from the cover 32 for connecting the circuit board 31 to a power source. Cooperatively, the junction box 412 and the circuit board 31 construct an electrical part of the LED illumination device 100 to provide drive power, control circuit and power management for the light sources 11.

Figure 4:
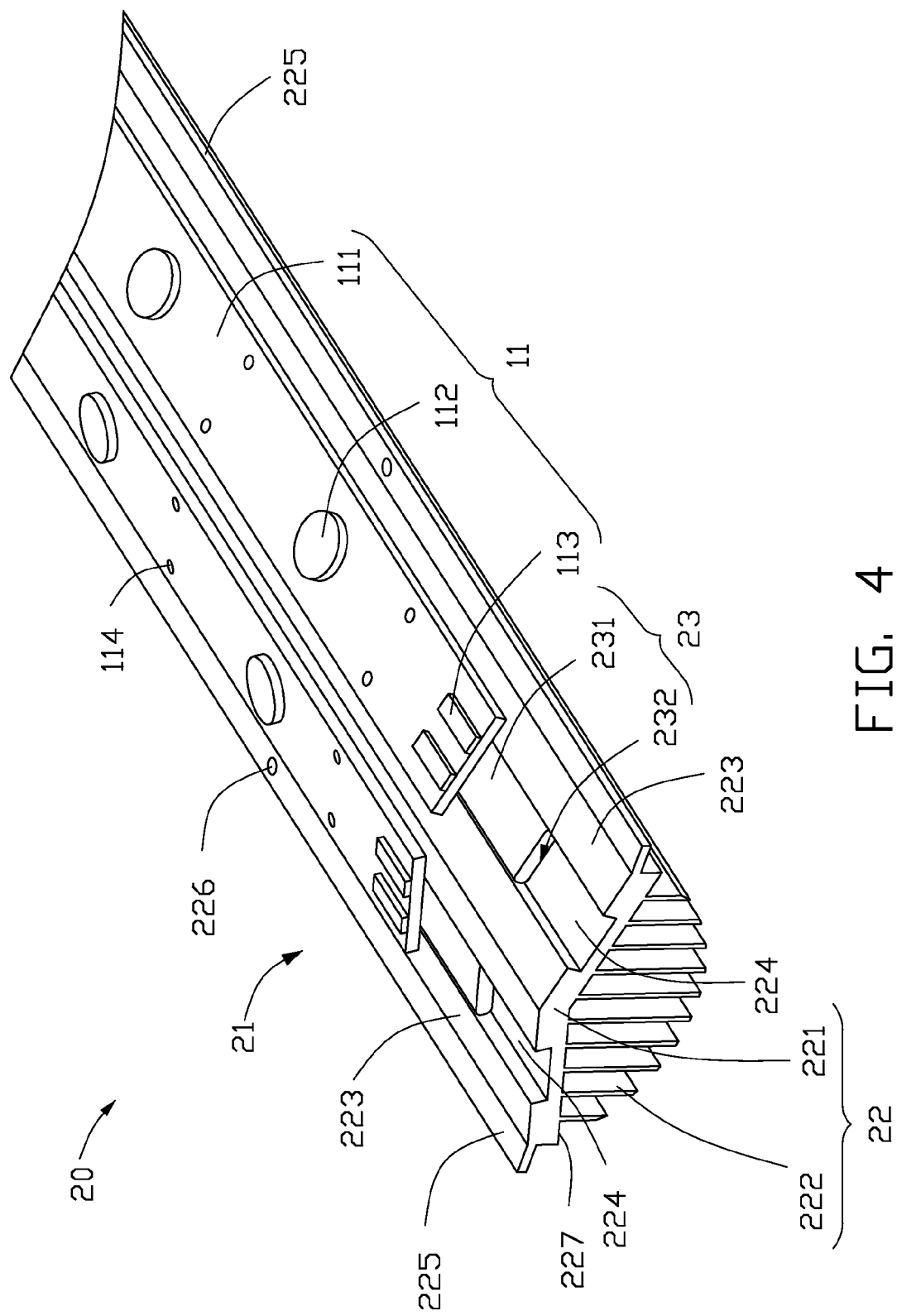
FIG. 4 shows a light engine of the LED illumination device of FIG. 1 viewed from a bottom side.

Referring to FIG. 4, each heat dissipation member 21 includes an elongated heat sink 22 and two heat pipes 23. The heat sink 22 includes a metal base 221 and a plurality of fins 222. A size of the base 221 is substantially the same as that of the opening 423 of the mounting wall 42. A pair of flanges 225 extend horizontally and outwardly from two lateral sides of the base 221, respectively. The flanges 225 define a plurality of apertures 226 therein, corresponding to the mounting holes 424 of the mounting wall 42.

The base 221 is substantially V-shaped, and has a convex surface 223 and an opposite concave surface 227. Each of the convex surface 223 and the concave surface 227 is constructed by two intersecting flat portions. The fins 222 extend vertically upwardly from the concave surface 227 of the base 221, and are arranged symmetric to a joint of the two flat portions of the concave surface 227. A height of the fins 222 decreases from the joint of the two flat portions of the concave surface 227 towards the two opposite lateral sides of the base 221. Top ends of the fins 222 cooperatively form an imaginary convex surface (not labeled). In other words, the fin 222 at the joint of the two flat portions of the concave surface 227 of the base 221 has a maximum height, and the fins 222 at the lateral sides of the base 221 have a minimum height. Thus a heat dissipation at a center of the heat sink 22 is enhanced.

A pair of grooves 224 are depressed from the two flat portions of the convex surface 223 of the base 221, respectively. The heat pipes 23 are respectively received in the two grooves 224 of the base 221. In this embodiment, each heat pipe 23 is flat, and includes a pair of opposite planar surfaces, including an absorbing surface 231 and an opposite dissipating surface 232. The grooves 224 each have a size and a shape substantially identical to that of each of the heat pipes 23. When the heat pipes 23 are mounted into the grooves 224, the dissipating surface 232 of each heat pipe 23 contacts the base 221 closely at a bottom of the groove 224, and the absorbing surface 231 of each heat pipe 23 is substantially coplanar with the corresponding flat portion of the convex surface 223 of the base 221. Thus three sides (except the absorbing surface 231)

of each of the heat pipes 23 contact the base 221 closely, which increases a heat transfer area between the heat sink 22 and the heat pipe 23.

The light source 11 is arranged on the convex surface 223 of the base 221 of the heat sink 22. In this embodiment, each light source 11 includes a pair of light bars. Alternatively, the amount of the light bars of the light source 11 can be changed according to the shape and size of the heat dissipation member 21. Each light bar includes a substrate 111 and a plurality of LEDs 112 arranged on the substrate 111. The substrate 111 is an elongated sheet. A pair of electrodes 113 are formed at an end of the substrate 111 corresponding to the junction box 412 of the mounting wall 42 of the lampshade 40. The LEDs 112 are substantially evenly distributed along the substrate 111, and are connected to the electrodes 113 electrically. A layer of thermal interface material (TIM) is applied between the substrate 111 and the LEDs 112 to eliminate an air interstice therebetween and thus to enhance a heat conduction efficiency between the LEDs 112 and the substrate 111. Alternatively, the LEDs 112 can be attached to the substrate 111 fixedly and closely through surface mount technology (SMT).

The substrate 111 has a width larger than that of the heat pipe 23. A plurality of fixing holes 114 are defined near lateral sides of the substrate 111. When assembled, each light bar is arranged on a corresponding heat pipe 23 with the substrate 111 thereof contacting the absorbing surface 231 of the heat pipe 23 closely. Fixing devices, such as screws, extend through the fixing holes 114 of the substrate 111 into the base 221 of the heat sink 22 to assemble the light source 11 onto the heat sink 22 to form the light engine 20. Then the light engines 20 are respectively mounted into corresponding openings 423 of the lampshade 40 to form the LED illumination device 100. The light source 11 of each light engine 20 extends through the opening 423 into the room 46 of the lampshade 40. The base 221 of the heat sink 22 is located in the opening 423 with the flanges 225 thereof abutting against the outer side 425 of the mounting wall 42. The fins 222 of the heat sink 22 protrude upwardly above the outer side 425 of the mounting wall 42 of the lampshade 40. Thus, fixing devices, such as screws, extend through the apertures 226 of the bases 221 and the corresponding mounting holes 424 of the mounting wall 42 to assemble the light engines 20 onto the lampshade 40.

During operation, the electrodes 113 of the light sources 11 are connected to the junction box 412 through wires 411 (FIG. 2). Thus, the power source can supply electric current to the LEDs 112 through the circuit board 31 and the junction box 412 to cause the LEDs 112 to emit light. The light of the LEDs 112 has a part traveling directly to an outside of the LED illumination device 100 and another part which is reflected by the lampshade 40 to the outside of the illumination device 100 for lighting. A large amount of heat is generated during operation of the LED illumination device 100. As the substrates 111 of the light sources 11 are attached to the absorbing surfaces 231 of the heat pipes 23, heat generated by the LEDs 112 can be conducted to the heat pipes 23 and then to the heat sink 22 for dissipating. It is well known that heat absorbed by liquid having a phase change (i.e. from liquid to vapor) is hundred times more than that of the liquid without phase change, and a heat transfer efficiency by phase change of liquid is much better than heat conduction or heat convection without phase change. Thus the heat pipes 23 can absorb heat from the light sources 11 quickly and transfer the heat to the heat sink 22 quickly. The heat of the LEDs 112 can be removed timely. The LEDs 112 can thus work at a lower temperature, and the brightness, lifespan, and reliability of the LED illumination device 100 will be improved.

Figure 5:
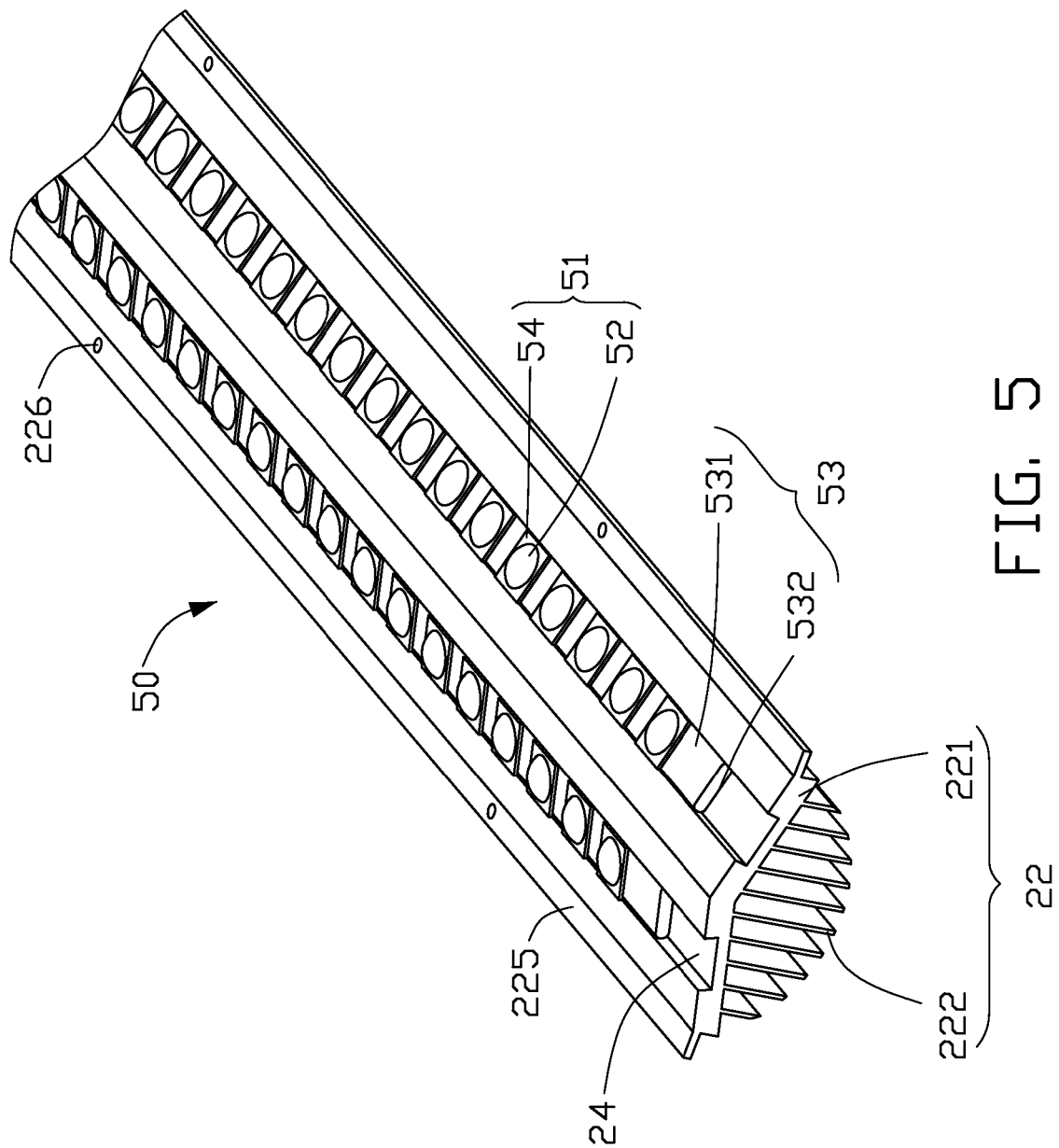
FIG. 5 is an isometric view of a light engine according to an alternative embodiment.

FIG. 5 shows an alternative light engine 50 including a heat sink 22, a pair of heat pipes 53 and a light source 51. The heat sink 22 is substantially the same as that shown in the first embodiment, which includes a base 221 and a plurality of fins 222. The base 221 defines grooves 224 receiving the heat pipes 53. The difference between this embodiment and the first embodiment is that the heat pipes 53 have a thickness larger than a depth of the grooves 224 of the heat sink 22, and thus the dissipating surfaces 532 of the heat pipes 53 contact the base 221 at the bottom of the grooves 224 whilst the absorbing surfaces 531 of the heat pipes 53 are higher than the base 221. The light source 51 includes a plurality of LEDs 52. Each LED 52 is arranged on a substrate 54. All of the substrates 54 with the LEDs 52 arranged thereon are evenly arranged along the heat pipe 53, and spaced from each other. The substrates 54 are secured to the absorbing surfaces 531 of the heat pips 53 by heat conductive adhesive. Thus the brightness of the LED illumination device can be changed easily by increasing/decreasing the number of the LEDs 52.

Figure 6:
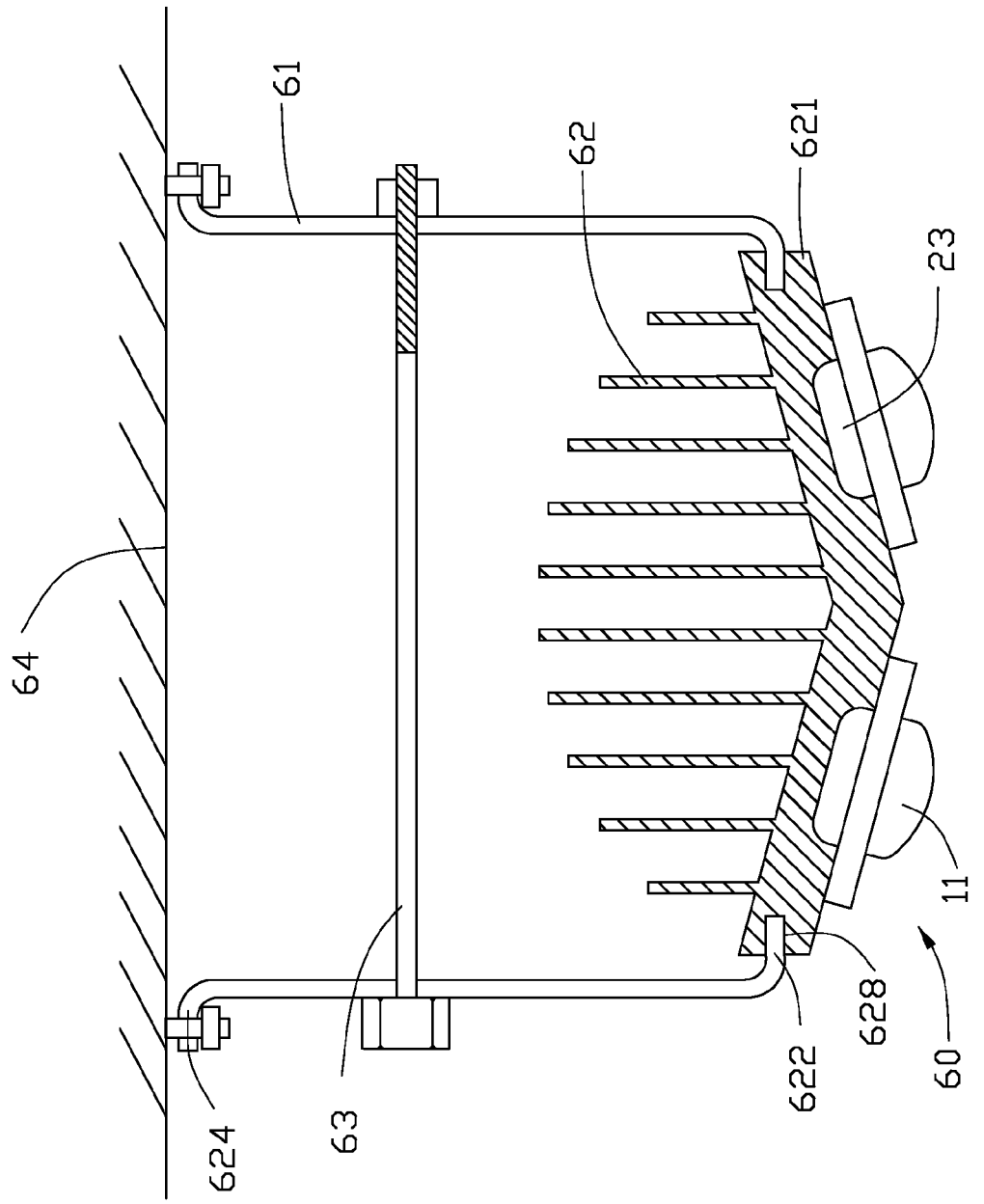
FIG. 6 is a cross section of a light engine according to a third embodiment.

Referring to FIG. 6, a light engine 60 according to a third embodiment includes a heat sink 62, a pair of heat pipes 23 embedded in a base 621 of the heat sink 62, and a light source 11 arranged on the heat pipes 23. The difference between this embodiment and the first embodiment is that the base 621 of the heat sink 62 defines a pair of slots 628 at two lateral sides thereof, respectively, and a pair of pothooks 61 are used for assembling the light engine 60 to a required position. Each pothook 61 forms a hook 622 at one end thereof engaging into the slot 628 of the base 621 of the heat sink 62, and the other end 624 of the pothook 61 is fixed onto a supporting structure, such as a wall 64. A screw 63 extends through the two pothooks 61 to assemble the pothooks 61 together. Accordingly, the pothooks 61 can more stably support the light engine 60. Although not shown, the lampshade 40 can be applied on the light engine 60 to cover the base 621 of the heat sink 62 and the light source 11 to protect the light source 11 and redirect the light generated by the light source 11.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. An LED illumination device, comprising:
a lampshade defining a room therein;
a plurality of LEDs being received in the room of the lampshade; and
a heat dissipation member arranged at a top side of the lampshade, comprising:
a heat pipe forming a planar absorbing surface and a dissipating surface opposite to the absorbing surface, the absorbing surface of the heat pipe attaching to the LEDs to absorb heat therefrom;
a heat sink including a base attaching to the dissipating surface of the heat pipe to absorb heat of the heat pipe and a plurality of fins extending from the base for dissipating heat absorbed from the heat pipe;
wherein the lampshade comprises a mounting wall and a side wall downwardly and slightly outwardly from a periphery of the mounting wall, cooperatively the mounting wall and the side wall defining the room receiving the LEDs;

wherein at least an opening is defined in the mounting wall accommodating the base of the heat sink therein, a pair of flanges respectively extending form two opposite lateral sides of the base and abutting a top side of the mounting wall to assemble the heat sink onto the mounting wall of the lampshade.

2. The LED illumination device of claim 1, wherein a groove is concaved from the base of the heat sink and receives the heat pipe therein, the dissipating surface of the heat pipe contacting the base at a bottom of the groove, and the absorbing surface of the heat pipe being coplanar with an outer surface of the base.

3. The LED illumination device of claim 1, wherein a groove is concaved from the base of the heat sink and receives the heat pipe therein, the dissipating surface of the heat pipe contacting the base at a bottom of the groove, and the absorbing surface of the heat pipe protruding out of the base.

4. The LED illumination device of claim 1, wherein a length of the fins decreases from a center towards two opposite lateral sides of the base.

5. The LED illumination device of claim 4, wherein a height of the fins decreases from a center towards the two opposite lateral sides of the base, and free ends of the fins cooperatively form a convex surface.

6. The LED illumination device of claim 1, wherein the base of the heat sink is substantially V-shaped, and forms a concave surface and an opposite convex surface, the fins extending upwardly from the concave surface, and the LEDs being arranged on the convex surface.

7. The LED illumination device of claim 1, wherein a pair of slots are defined in lateral sides of the base of the heat sink, and engage with a pair of pothooks adapted for fixing the LED illumination device to a supporting structure.

8. A light engine, comprising:
a flat-type heat pipe forming a planar absorbing surface and a planar dissipating surface opposite to the absorbing surface;
a plurality of LEDs attaching to the absorbing surface of the heat pipe; and
a heat sink comprising a base attaching to the dissipating surface of the heat pipe and a plurality of fins extending from the base;
wherein the base of the heat sink defines a pair of slots at two lateral sides thereof adapted for receiving two ends of two pothooks, respectively, for assembling the light engine to a supporting structure.

9. The light engine of claim 8, wherein the base of the heat sink is substantially V-shaped, and forms a concave surface and an opposite convex surface, the fins extending from the concave surface, and the LEDs being arranged on the convex surface.

10. The light engine of claim 9, wherein a height of the fins decreases from a center towards two opposite lateral sides of the base, and free ends of the fins cooperatively form a convex surface.

11. The light engine of claim 8, wherein a groove is concaved from the base of the heat sink and receives the heat pipe therein, the dissipating surface of the heat pipe contacting the base at a bottom of the groove, and the absorbing surface of the heat pipe being coplanar with an outer surface of the base.

12. The light engine of claim 8, wherein a groove is concaved from the base of the heat sink and receives the heat pipe therein, the dissipating surface of the heat pipe contacting the base at a bottom of the groove, and the absorbing surface of the heat pipe protruding out of the base.

13. The light engine of claim 8, wherein the base of the heat sink forms a pair of flanges at two lateral sides thereof adapted for mounting the light engine to a lampshade of a lamp.

14. An LED illumination device, comprising:
a lampshade defining a room therein;
a plurality of LEDs being received in the room of the lampshade; and
a heat dissipation member arranged at a top side of the lampshade, comprising:
a heat pipe forming a planar absorbing surface and a dissipating surface opposite to the absorbing surface, the absorbing surface of the heat pipe attaching to the LEDs to absorb heat therefrom;
a heat sink including a base attaching to the dissipating surface of the heat pipe to absorb heat of the heat pipe and a plurality of fins extending from the base for dissipating heat absorbed from the heat pipe;
wherein a pair of slots are defined in lateral sides of the base of the heat sink, and engage with a pair of pothooks adapted for fixing the LED illumination device to a supporting structure.

* * * * *